(12) United States Patent
Nanbu et al.

(10) Patent No.: US 10,259,073 B2
(45) Date of Patent: Apr. 16, 2019

(54) METHOD FOR PRODUCING METAL LAMINATE MATERIAL

(71) Applicant: Toyo Kohan Co., Ltd., Chiyoda-ku, Tokyo (JP)

(72) Inventors: Kouji Nanbu, Kudamatsu (JP); Teppei Kurokawa, Kudamatsu (JP); Takashi Koshiro, Kudamatsu (JP); Hironao Okayama, Kudamatsu (JP)

(73) Assignee: Toyo Kohan Co., Ltd., Tokyo (JP)

( * ) Notice: Subject to any disclaimer, the term of this patent is extended or adjusted under 35 U.S.C. 154(b) by 0 days.

(21) Appl. No.: 15/300,874

(22) PCT Filed: Mar. 27, 2015

(86) PCT No.: PCT/JP2015/059598
§ 371 (c)(1),
(2) Date: Sep. 30, 2016

(87) PCT Pub. No.: WO2015/152041
PCT Pub. Date: Oct. 8, 2015

(65) Prior Publication Data
US 2017/0014941 A1    Jan. 19, 2017

(30) Foreign Application Priority Data
Apr. 1, 2014 (JP) ................................. 2014-075602

(51) Int. Cl.
*B23K 20/00* (2006.01)
*B23K 20/227* (2006.01)
(Continued)

(52) U.S. Cl.
CPC .......... *B23K 20/2275* (2013.01); *B23K 20/02* (2013.01); *B23K 20/04* (2013.01);
(Continued)

(58) Field of Classification Search
CPC .... B23K 20/2275; B23K 20/04; B23K 20/24; B23K 20/00; B23K 2203/20;
(Continued)

(56) References Cited

U.S. PATENT DOCUMENTS 2,809,422 A * 10/1957 Schultz .............. B23K 20/2275
228/199
3,210,840 A * 10/1965 Ulam ................. B23K 20/2275
228/193

(Continued)

FOREIGN PATENT DOCUMENTS

EP       0091371        10/1963
GB       2117282 A  *  10/1983  ............. B23K 20/04
(Continued)

OTHER PUBLICATIONS

International Search Report based on co-pending International Application No. PCT/JP2015/059598, dated Jun. 30, 2015—2 Pages.
(Continued)

*Primary Examiner* — Kiley S Stoner
(74) *Attorney, Agent, or Firm* — McCarter & English, LLP

(57) ABSTRACT

An object of the present invention is to provide a production method for efficiently producing a metal laminate having high bonding strength. A method for producing a metal laminate material comprising the steps of: sputter etching faces to be bonded of a stainless steel and an aluminum such that an oxide layer remains on each face; temporarily bonding the faces to be bonded of the stainless steel and the aluminum by roll pressure bonding; and thermally treating the temporarily bonded laminate material at a temperature lower than the recrystallization temperature of the stainless steel to thermally diffuse at least a metal element comprised in the stainless steel into the aluminum.

8 Claims, 5 Drawing Sheets

(51) Int. Cl.
| | |
|---|---|
| *B32B 15/01* | (2006.01) |
| *C22C 21/00* | (2006.01) |
| *C22C 38/02* | (2006.01) |
| *C22C 38/04* | (2006.01) |
| *C22C 38/44* | (2006.01) |
| *B23K 20/02* | (2006.01) |
| *B23K 20/04* | (2006.01) |
| *B23K 20/24* | (2006.01) |
| *B32B 15/04* | (2006.01) |
| *B32B 15/18* | (2006.01) |
| *B32B 15/20* | (2006.01) |
| *C23F 4/00* | (2006.01) |
| *H01J 37/34* | (2006.01) |
| *B23K 103/04* | (2006.01) |
| *B23K 103/10* | (2006.01) |
| *B23K 103/20* | (2006.01) |
| *B23K 103/16* | (2006.01) |

(52) U.S. Cl.
CPC ............ *B23K 20/24* (2013.01); *B32B 15/01* (2013.01); *B32B 15/012* (2013.01); *B32B 15/043* (2013.01); *B32B 15/18* (2013.01); *B32B 15/20* (2013.01); *C22C 21/00* (2013.01); *C22C 38/02* (2013.01); *C22C 38/04* (2013.01); *C22C 38/44* (2013.01); *C23F 4/00* (2013.01); *H01J 37/34* (2013.01); *B23K 2103/05* (2018.08); *B23K 2103/10* (2018.08); *B23K 2103/166* (2018.08); *B23K 2103/20* (2018.08)

(58) Field of Classification Search
CPC .......... B23K 2203/10; B23K 2203/166; B23K 20/02–20/028; B23K 20/001; B23K 2203/04–2203/05; B32B 15/18; B32B 15/20; B32B 15/043; B32B 15/012; B32B 15/01; C23F 4/00; H01J 37/34; C22C 38/04; C22C 38/44; C22C 38/02; C22C 21/00
USPC .... 228/193–195, 233.1–234.1, 235.1–235.2, 228/262.41, 262.5
See application file for complete search history.

(56) References Cited

U.S. PATENT DOCUMENTS

| | | | | | |
|---|---|---|---|---|---|
| 3,261,724 | A | * | 7/1966 | Ulam ................. | B23K 20/2275 148/531 |
| 3,295,197 | A | * | 1/1967 | Bunn ................. | B23K 20/2275 228/175 |
| 3,386,161 | A | * | 6/1968 | Ruf ................... | B23K 20/04 228/160 |
| 3,620,880 | A | * | 11/1971 | Lemelson ............ | B23K 20/04 156/384 |
| 4,046,304 | A | * | 9/1977 | Tabata ............... | B23K 20/2275 228/187 |
| 4,202,709 | A | * | 5/1980 | Shibamori ........... | B23K 20/04 148/531 |
| 4,699,309 | A | * | 10/1987 | Atsuta ................ | B23K 20/22 228/116 |
| 4,896,813 | A | * | 1/1990 | Saijo ................. | B23K 20/14 204/192.32 |
| 2006/0275623 | A1 | * | 12/2006 | Takeda ............... | B23K 35/0261 428/653 |
| 2009/0011269 | A1 | * | 1/2009 | Urushihara .......... | B23K 11/115 428/594 |
| 2009/0084774 | A1 | * | 4/2009 | Wakisaka ............ | B23K 13/01 219/633 |
| 2011/0097595 | A1 | * | 4/2011 | Takeda ............... | B23K 9/007 428/594 |
| 2011/0123825 | A1 | * | 5/2011 | Sakurai .............. | B23K 11/115 428/650 |
| 2011/0232629 | A1 | * | 9/2011 | Mandel .............. | F24J 2/07 126/570 |
| 2014/0199114 | A1 | * | 7/2014 | Deshpande ........... | B23K 20/02 403/271 |
| 2017/0014942 | A1 | * | 1/2017 | Nanbu ............... | B32B 15/01 |

FOREIGN PATENT DOCUMENTS

| | | | | |
|---|---|---|---|---|
| GB | 2144061 | A * | 2/1985 | ............ B23K 20/04 |
| JP | 61056786 | A * | 3/1986 | ............ B23K 20/16 |
| JP | 63194880 | A * | 8/1988 | ............ B23K 20/04 |
| JP | 1-224184 | | 9/1989 | |
| JP | 2-133563 | | 5/1990 | |
| JP | 02220788 | A * | 9/1990 | |
| JP | 03008587 | A * | 1/1991 | |
| JP | 03023087 | A * | 1/1991 | |
| JP | 03150151 | A * | 6/1991 | |
| JP | 03258471 | A * | 11/1991 | |
| JP | 04033783 | A * | 2/1992 | |
| JP | 04041085 | A * | 2/1992 | |
| JP | 07223081 | A * | 8/1995 | |
| JP | 9-70918 | | 3/1997 | |
| JP | 2903658 | B2 * | 6/1999 | |
| JP | 11319970 | A * | 11/1999 | |
| JP | 2004-306458 | | 11/2004 | |
| JP | 2005-74913 | | 3/2005 | |
| JP | 2005230827 | A * | 9/2005 | ............ B23K 20/06 |
| JP | 2006-159797 | | 6/2006 | |
| KR | 2002-0090579 | | 12/2002 | |

OTHER PUBLICATIONS

European Search Report based on co-pending European Patent Application No. 15774429.3, dated Oct. 25, 2017—4 Pages.

* cited by examiner

METHOD FOR PRODUCING METAL LAMINATE MATERIAL

RELATED APPLICATIONS

This application is a national stage application filed under 35 USC 371 of PCT/JP2015/059598, filed Mar. 27, 2015, which claims the benefit of Japanese Patent Application No. 2014-075602, filed Apr. 1, 2014, all of which are incorporated herein, in entirety, by reference.

TECHNICAL FIELD

The present invention relates to a method for producing a metal laminate material comprising a stainless steel and an aluminum laminated. The present invention also relates to a metal laminate material obtained by this production method.

BACKGROUND ART

Metal laminate materials comprising two or more metal sheets laminated (clad materials), which have composite properties not achievable with a single material, find use in various fields. Examples of the metal laminate material known include metal laminate materials comprising copper/nickel, copper/aluminum, and stainless steel/aluminum.

Of these, the metal laminate materials comprising stainless steel and aluminum are widely used because such materials combine both properties of lightness from aluminum and strength from stainless steel, thus having formability and thermal conductivity higher than those of materials comprising stainless steel singly.

In addition, as a method for producing a metal laminate material, for example, Patent Literature 1 describes a method for producing a clad metal plate, wherein, after the faces to be bonded of dissimilar metal sheets are pre-activated in a vacuum vessel under specific conditions, the dissimilar metal sheets are polymerized and subjected to cold rolling bonding.

CITATION LIST

Patent Literature

Patent Literature 1: JP Patent Publication (Kokai) No. 1-224184A (1989)

SUMMARY OF INVENTION

Technical Problem

Unfortunately, for conventional metal laminate materials, unless surface adsorbates and oxide layers on the surfaces of metal sheets to be laminated are completely removed during their production, metal laminate materials having sufficient bonding strength cannot be provided. However, complete removal of the oxide layers on the surfaces of the metal sheets is time-consuming, and thus, the conventional methods for producing a metal laminate material cannot improve the productivity.

Thus, an object of the present invention is to provide a production method for efficiently producing a metal laminate having high bonding strength.

Solution to Problem

The present inventors have made extensive investigations to solve the aforementioned problems and, as a result, found that, in production of a metal laminate material comprising a stainless steel and an aluminum laminated, the metal laminate material which has high bonding strength and in which softening of the stainless steel is prevented can be efficiently produced by temporarily bonding faces to be bonded of the stainless steel and the aluminum having an oxide layer remaining on the surface of the face to be bonded followed by thermally treating the temporarily bonded laminate material at a specific temperature, having completed the present invention. That is, the gist of the present invention is as follows.

(1) A method for producing a metal laminate material comprising the steps of: sputter etching faces to be bonded of a stainless steel and an aluminum such that an oxide layer remains on each face; temporarily bonding the faces to be bonded of the stainless steel and the aluminum by roll pressure bonding; and thermally treating the temporarily bonded laminate material at a temperature lower than the recrystallization temperature of the stainless steel to thermally diffuse at least a metal element comprised in the stainless steel into the aluminum.

(2) The method for producing a metal laminate material according to (1), wherein, in the thermally diffusing step, 8 atm % or more of at least Fe element comprised in the stainless steel is diffused at a point 5 nm in the aluminum direction from the bonding interface.

(3) The method for producing a metal laminate material according to (1) or (2), wherein the thermally diffusing step comprises thermally treating the temporarily bonded laminate material at a temperature lower than the recrystallization temperature of the stainless steel to thermally diffuse the metal element comprised in the stainless steel and the aluminum to each other.

(4) The method for producing a metal laminate material according to any of (1) to (3), wherein the thermal treatment temperature is from 100° C. to 500° C.

(5) The method for producing a metal laminate material according to any of (1) to (4), wherein the thermal treatment temperature is from 200° C. to 400° C.

(6) The method for producing a metal laminate material according to any of (1) to (5), wherein the etching amount of the surface of the face to be bonded of the stainless steel is from 1 nm to 10 nm.

(7) The method for producing a metal laminate material according to any of (1) to (6), wherein the etching amount of the surface of the face to be bonded of the aluminum is from 1 nm to 10 nm.

(8) A metal laminate material obtained by the production method according to any of (1) to (7).

The present description includes the contents as disclosed in the description and/or drawings of Japanese Patent Application No. 2014-075602, which is a priority document of the present application.

Advantageous Effects of Invention

According to the present invention, a metal laminate material comprising a stainless steel and an aluminum laminated and having a high bonding strength can be produced efficiently without softening of the stainless steel.

DESCRIPTION OF EMBODIMENTS

The present invention will now be described in detail below.

The metal laminate material of the present invention is a metal laminate material comprising a stainless steel and an aluminum laminated. The metal laminate material of the present invention may have the stainless steel laminated on only one side of the aluminum, have the stainless steel laminated on both sides of the aluminum, or have the aluminum laminated on both sides of the stainless steel.

Examples of the stainless steel that can be used in the metal laminate material of the present invention include, but not particularly limited to, sheet materials such as SUS304, SUS201, SUS316, SUS316L, and SUS430. These stainless steel having a thickness of 0.01 mm or more are usually applicable. From the viewpoint of the mechanical strength and processability of the metal laminate material to be obtained, the thickness is preferably from 0.01 mm to 1 mm, but is not limited to this range.

As the aluminum that can be used in the metal laminate material of the present invention, pure aluminum or aluminum alloys may be used without particular limitation. Aluminum alloys that can be used are aluminum alloys and the like specified by JIS such as 1000 series, 3000 series, and 5000 series. Aluminum having a thickness of 0.01 mm or more is usually applicable. From the viewpoint of the mechanical strength and processability of the metal laminate material to be obtained, the thickness is preferably from 0.01 mm to 1 mm, but is not limited to this range.

Figure 1:
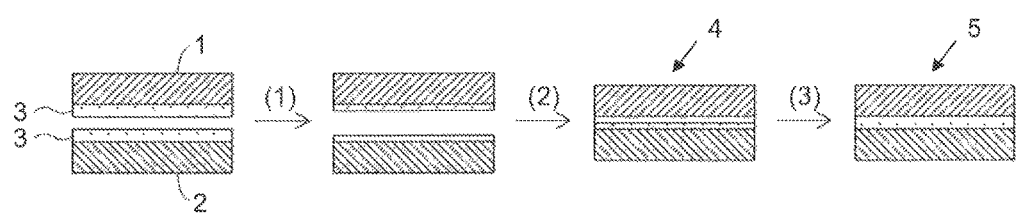
FIG. 1 is a diagram showing the production steps of a metal laminate material of the present invention.

The method for producing a metal laminate material of the present invention will be described with reference to FIG. 1. The metal laminate material 5 of the present invention can be produced by a method comprising the steps of: (1) sputter etching faces to be bonded of a stainless steel 1 and an aluminum 2 such that an oxide layer 3 remains on each face; (2) temporarily bonding the faces to be bonded of the stainless steel 1 and the aluminum 2 by roll pressure bonding; and (3) thermally treating the temporarily bonded laminate material 4 at a temperature lower than the recrystallization temperature of the stainless steel to thermally diffuse at least a metal element comprised in the stainless steel into the aluminum.

In the step (1) of the method for producing a metal laminate material of the present invention, faces to be bonded of the stainless steel and the aluminum is sputter etched such that an oxide layer remains. The method for producing a metal laminate material of the present invention is characterized in that an oxide layer remains although adsorbates on the surface of the faces to be bonded of the stainless steel and the aluminum are completely removed by the sputter etching treatment. Thus, in comparison with conventional methods for producing a metal laminate material, which completely remove surface adsorbates and surface oxide layers by the sputter etching treatment, it is possible to greatly reduce the time for the sputter etching treatment and to improve the productivity of the metal laminate material.

The sputter etching treatment can be conducted specifically as follows: a stainless steel and an aluminum are each provided in the form of a long coil having a width of 100 mm to 600 mm. An alternating current at 1 MHz to 50 MHz is applied between one electrode including the stainless steel and the aluminum each having a face to be bonded each grounded and the other electrode insulatingly supported to generate glow discharge, provided that the area of the electrode to be exposed into plasma generated by the glow discharge is one-thirds or less of the area of the other electrode. During the sputter etching treatment, the grounded electrode, which takes the form of a cooling roll, prevents increase in the temperature of each conveyed material.

In the sputter etching treatment, sputtering of the faces to be bonded of the stainless steel and the aluminum with an inert gas under vacuum completely removes surface adsorbates and allows surface oxide layers to remain. Examples of the inert gas that can be applied include argon, neon, xenon, krypton, and mixed gases containing at least one of these. Surface adsorbates both on the stainless steel and aluminum can be completely removed with an etching amount of the order of about 1 nm.

The sputter etching treatment on the stainless steel can be conducted under vacuum, for example, at a plasma output of 100 W to 10 KW and a line speed of 1 m/minute to 30 m/minute. The degree of vacuum at this time may be, for example, from $1 \times 10^{-5}$ Pa to 10 Pa although a higher degree is preferable in order to prevent readsorbates onto the surface. The temperature of the stainless steel in the sputter etching treatment is preferably maintained at ordinary temperature to 150° C. from the viewpoint of prevention of softening.

In the present invention, a stainless steel having an oxide layer remaining on its surface can be obtained by setting the etching amount of the stainless steel to 1 nm to 10 nm, for example.

The sputter etching treatment on the aluminum can be conducted under vacuum, for example, at a plasma output of 100 W to 10 KW and a line speed of m/minute to 30 m/minute. The degree of vacuum at this time may be from $1 \times 10^{-5}$ Pa to 10 Pa although higher degree is preferable in order to prevent readsorbates onto the surface.

In the present invention, an aluminum having an oxide layer remaining on its surface can be obtained by setting the etching amount of the aluminum to 1 nm to 10 nm.

In the step (2) of the method for producing a metal laminate material of the present invention, the faces to be bonded of the stainless steel and the aluminum subjected to the sputter etching treatment are temporarily bonded by roll pressure bonding.

The rolling line load of roll pressure bonding for temporarily bonding the faces to be bonded of the stainless steel and the aluminum is, but not particularly limited to, from 0.1 to 10 tf/cm, for example. Also the temperature on temporary bonding by roll pressure bonding is, but not particularly limited to, from ordinary temperature 150° C., for example.

The temporary bonding by roll pressure bonding is preferably conducted in a non-oxidizing atmosphere, for example, an inert gas atmosphere such as Ar in order to prevent decrease in the bonding strength between the stainless steel surface and the aluminum surface due to readsorption of oxygen onto the surfaces.

In the step (3) of the method for producing a metal laminate material of the present invention, a laminate material of the stainless steel and the aluminum temporarily bonded is subjected to thermal treatment. This thermal treatment is required to be conducted at a temperature lower than the recrystallization temperature of the stainless steel. For example, the recrystallization temperature of the stainless steel (SUS316) is 533.85° C. This is for prevention of softening of the stainless steel due to recrystallization.

Additionally, this thermal treatment is required to be conducted at a temperature where at least a metal element in the stainless steel thermally diffuses into the aluminum. This metal element is Fe, Cr, or Ni, for example. This thermal diffusion improves the bonding strength. Preferably, by the thermal treatment, 8 atm % or more of at least Fe element comprised in the stainless steel diffuses at a point 5 nm in the aluminum direction from the bonding interface of the laminate material of the stainless steel and the aluminum. This further improves the bonding strength of the metal laminate material to be obtained. Incidentally, the metal element comprised in the stainless steel and the aluminum may be allowed to thermally diffuse into each other.

Specifically, the thermal treatment can be conducted at a temperature of 100° C. to 500° C. With the thermal treatment temperature in this range, the metal laminate material to be obtained can have high bonding strength and reinforcing material hardness by thermal diffusion, and softening of the stainless steel due to recrystallization by heating can be prevented. The thermal treatment temperature is preferably from 200° C. to 400° C. from the viewpoint of further improving the bonding strength as well as preventing softening of the stainless steel. Although the thermal treatment time depends on the temperature, the laminate material may be maintained for the order of one second (the time of temperature rise is not included) to 240 minutes at 300° C., for example.

The present invention also relates to a metal laminate material obtained by the aforementioned production method.

In one embodiment of the present invention, the metal laminate material of the present invention can be obtained by a production method comprising the steps of: sputter etching faces to be bonded of a stainless steel and an aluminum such that an oxide layer remains on each face; temporarily bonding the faces to be bonded of the stainless steel and the aluminum by roll pressure bonding; and thermally treating the temporarily bonded laminate material at a temperature of 100° C. to 500° C. preferably 200° C. to 400° C.

EXAMPLES

The present invention will be described in further detail hereinbelow referring to Examples and Comparative Examples, but the present invention is not intended to be limited to these Examples.

Example 1

As the stainless steel, SUS304-BA (thickness 0.05 mm) was used, and as the aluminum, A1050-H18 (thickness 0.18 mm) was used. When the surfaces of SUS304-BA and A1050-H18 were measured with a scanning Auger Electron spectrometer (AES), the thickness of the SUS304-BA oxide layer was from 10 to 15 nm and the thickness of the A1050-H18 oxide layer was from 80 to 150 nm. SUS304-BA and A1050-H18 were subjected to sputter etching treatment. SUS304-BA was sputter etched under 0.1 Pa at a plasma output of 800 W and a line speed of 3.5 m/minute and A1050-H18 was sputter etched under 0.1 Pa at a plasma output of 2600 W and a line speed of 3.5 m/minute to thereby completely remove adsorbates on the surfaces of SUS304-BA and A1050-H18. The etching amount of SUS304-BA was about 2 nm and the etching amount of A1050-H18 was about 6 nm. SUS304-BA and A1050-H18 after the sputter etching treatment were temporarily bonded at ordinary temperature by roll pressure bonding at a rolling line load of 2 tf/cm (rolling load of 0.4 MN) to thereby form a laminate material.

Figure 2:
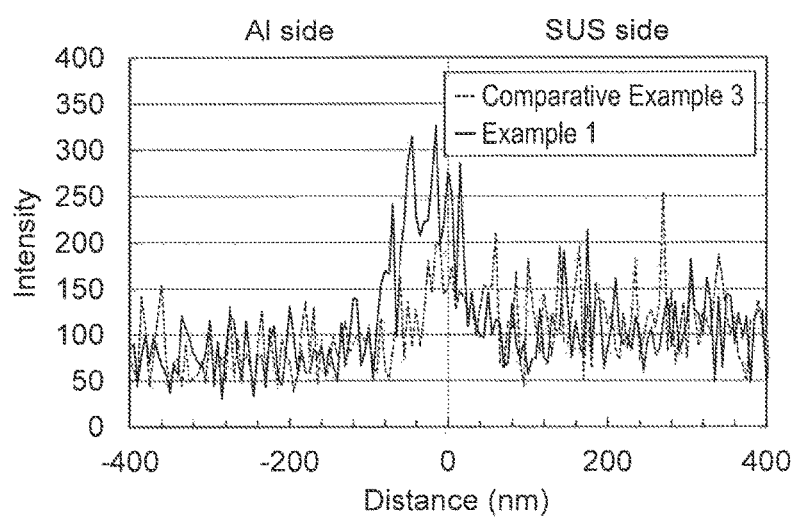
FIG. 2 is a graph showing the AES analysis results of the temporarily bonded laminate materials of Example 1 and Comparative Example 3.

The temporarily bonded laminate material obtained was subjected to AES analysis. The results of AES analysis on the temporarily bonded laminate material of Example 1 and the temporarily bonded laminate material of Comparative Example 3 described below are shown in FIG. 2. As seen from FIG. 2, peaks derived from oxygen (O) were observed in the front and back of the temporarily bonded laminate material interface, and it was confirmed that an oxide layer remains on the respective surfaces of SUS304-BA and A1050-H18.

The temporarily bonded laminate material was thermally treated at 240° C. for 30 minutes. The metal laminate material obtained was measured for peel strength (90°).

Comparative Example 1

Comparative Example 1 was the same as Example 1 except that no thermal treatment was conducted on the temporarily bonded laminate material.

Comparative Example 2

Comparative Example 2 was the same as Example 1 except that no sputter etching treatment was conducted. At the interface of the laminate material after temporarily bonded, oxide layers and adsorbates remained on the respective surfaces of SUS304-BA and A1050-H18.

Comparative Example 3

As the stainless steel, SUS304-BA (thickness 0.05 mm) was used, and as the aluminum, A1050-H18 (thickness 0.17 mm) was used. SUS304-BA and A1050-H18 were subjected to sputter etching treatment. SUS304-BA was sputter etched under 0.1 Pa at a plasma output of 700 W for a time for sputtering the face to be bonded of 180 minutes, and A1050-H18 was sputter etched under 0.1 Pa at a plasma output of 700 W for a time for sputtering the face to be bonded of 180 minutes (the sheet was sputter etched in a stationary state without moved. The line speed can be converted to a line speed of $5.6 \times 10^{-3}$ m/minute under conditions of sputter etching while the sheet passed through the line as in Example 1) to thereby completely remove adsorbates and oxide layers on the surface of SUS304-BA and A1050-H118. The etching amount of SUS304-BA was about 600 nm and the etching amount of A1050-H18 was about 460 nm. SUS304-BA and A1050-H18 after the sputter etching treatment were temporarily bonded at ordinary temperature by roll pressure bonding at a rolling line load of 2 tf/cm (rolling load of 0.4 MN) to thereby form a laminate material. The temporarily bonded laminate material obtained was measured for peel strength (90°).

Comparative Example 4

The temporarily bonded laminate material obtained as in Comparative Example 3 was thermally treated at 240° C. for 30 minutes. The metal laminate material obtained was measured for peel strength.

Figure 3:
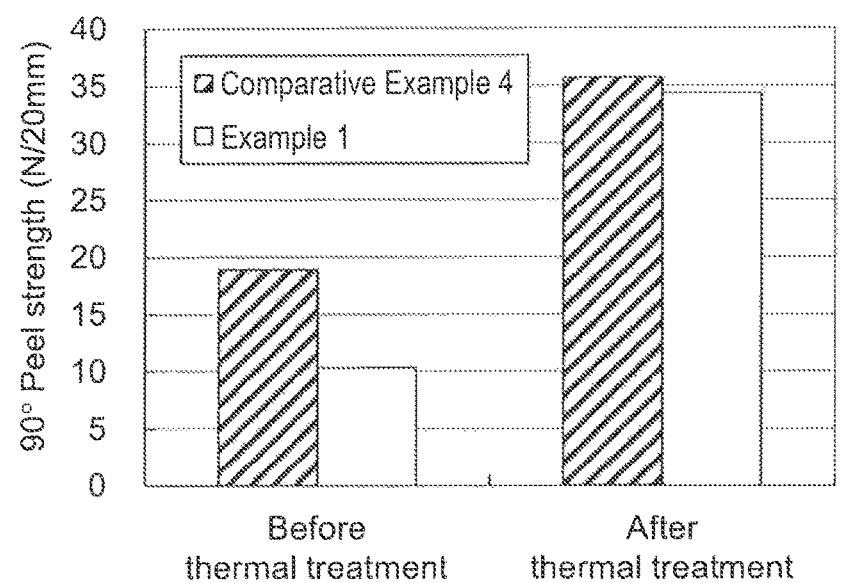
FIG. 3 is a graph showing the peel strength of the metal laminate materials of Example 1 and Comparative Example 4 before and after thermally treated.

The peel strengths of the metal laminate materials of Example 1 and Comparative Examples 1 to 4 are shown in Table 1. The peel strengths of the metal laminate materials of Example 1 and Comparative Example 4 before and after the thermal treatment are also shown in FIG. 3. The laminate materials before the thermal treatment of the metal laminate materials of Example 1 and Comparative Example 4 here respectively correspond to the laminate materials of Comparative Examples 1 and 3.

TABLE 1

|  | Etching amount (nm) | | Interface oxide layer after temporary bonding | Thermal treatment temperature (° C.) | Peel strength (N/20 mm) |
| --- | --- | --- | --- | --- | --- |
|  | Al face | SUS face |  |  |  |
| Example 1 | 6 | 2 | Yes | 240 | 34 |
| Comparative Example 1 | 6 | 2 | Yes | No | 10 |
| Comparative Example 2 | 0 | 0 | Yes, including adsorbates | 240 | 0 |
| Comparative Example 3 | 460 | 600 | No | No | 19 |
| Comparative Example 4 | 460 | 600 | No | 240 | 36 |

As seen from Table 1, the metal laminate material of Example 1 achieved improved peel strength by being thermally treated (Example 1 and Comparative Example 1). Additionally, the metal laminate material of Example 1, which was obtained by allowing oxide layers to remain on the surfaces of SUS304-BA and A1050-H18, achieved peel strength equivalent to that of the metal laminate material of Comparative Example 4, which was obtained by completely removing oxide layers from the surfaces of SUS304-BA and A1050-H18. Example 1 was also able to reduce the sputter etching time by about 63-fold relative to Comparative Example 4 (calculated from the converted value of line speed of $5.6 \times 10^{-3}$ m/minute in Comparative Example 4 relative to the line speed of 3.5 m/minute in Example 1). In addition, as seen from FIG. 3, the metal laminate material of Example 1 exhibited an improvement in the peel strength before and after the thermal treatment greater than that of the metal laminate material of Comparative Example 4.

Examples 2 to 6 and Comparative Examples 5 and 6

In Examples 2 to 6 and Comparative Examples 5 and 6, influences of the thermal treatment temperatures of the temporarily bonded laminate materials on the peel strength and hardness of the metal laminate materials to be obtained were examined.

In Examples 2 to 6 and Comparative Examples 5 and 6, temporarily bonded laminate materials were obtained in the same manner as Example 1 except that SUS304-BA having a thickness of 0.05 mm was replaced with SUS304-1/2H having a thickness of 0.1 mm and A1050-H18 having a thickness of 0.18 mm was replaced with AL1050 (H24) having a thickness of 0.4 mm, that sputter etching was conducted by changing the line speed of 3.5 m/minute to a line speed of 3.0 m/minute, and that temporary bonding by roll pressure bonding was conducted by changing the rolling line load of 2 tf/cm to a rolling line load of about 2.8 tf/cm. The etching amount of SUS304-1/2H was 3 nm and the etching amount of AL1050 (H24) was 5 nm. The temporarily bonded laminate materials obtained were thermally treated at a predetermined temperature for 240 minutes. The thermal treatment temperatures in Examples 2 to 6 and Comparative Examples 5 and 6 are shown in Table 2. The metal laminate materials obtained were measured for the amount of iron (Fe) at a point 5 nm in the aluminum layer from the bonding interface of the metal laminate materials, peel strength (90°), and hardness on the SUS side. The results are shown in Table 2.

TABLE 2

|  | Etching amount (nm) | | Interface oxide layer after temporary bonding | Thermal treatment temperature (° C.) | Amount of Fe at point 5 nm into the aluminum layer from interface (atm %) | Peel strength (N/20 mm) | Reinforcing material hardness Hv |
| --- | --- | --- | --- | --- | --- | --- | --- |
|  | Al face | SUS face |  |  |  |  |  |
| Example 2 | 5 | 3 | Yes | 100 | 2.6 | 24 | 393 |
| Example 3 | 3 | 3 | Yes | 200 | 8.1 | 49 | 390 |
| Example 4 | 5 | 3 | Yes | 300 | 8.8 | 85 | 392 |
| Example 5 | 5 | 3 | Yes | 400 | 10.7 | 130 | 393 |
| Example 6 | 5 | 3 | Yes | 500 | 15 | Al breakage | 369 |
| Comparative Example 5 | 5 | 3 | Yes | No | 0 | 22 | 393 |
| Comparative Example 6 | 5 | 3 | Yes | 600 | — | delamination | 322 |

As seen from Table 2, the metal laminate materials of Examples 2 to 6, of which thermal treatment temperatures were from 100° C. to 500° C., had higher peel strength as well as higher hardness than those of metal laminate materials of Comparative Examples 5 and 6, of which thermal treatment temperatures were outside this temperature range. As for the amount of iron (Fe) at a point 5 nm in the aluminum layer from the bonding interface of the metal laminate materials, as the thermal treatment temperature was increased in the measurement range, diffusion of the iron, which was a component of stainless steel, into the aluminum layer was increased. This is assumed to increase the peel strength of the metal laminate material. Within the range of the thermal treatment temperature of 100° C. to 500° C. the higher the thermal treatment temperature became, the higher the peel strength became.

Incidentally, as for the amount of iron (Fe) at a point 5 nm in the aluminum layer from the bonding interface of the metal laminate materials, it is believed that diffusion in the amount of more preferably 8 atm % or more is effective for an improvement in the bonding strength.

(Removal of Surface Adsorption Layer)

Figure 4:
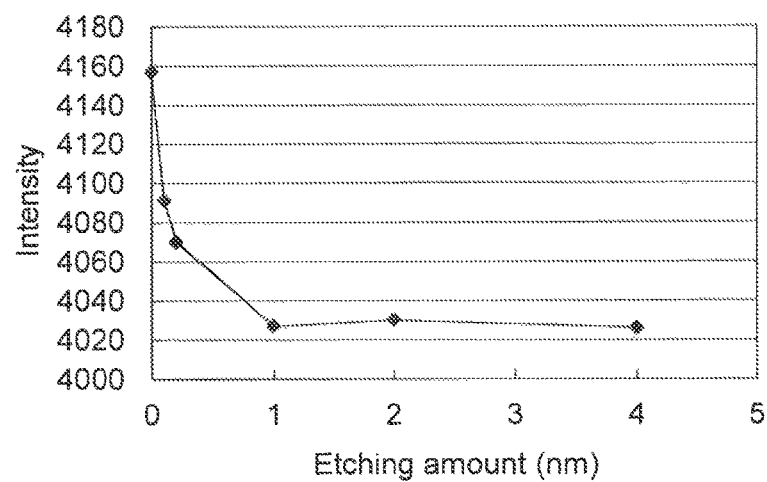
FIG. 4 is a graph showing the relationship between the sputter etching amount and the surface adsorbate layer of the stainless steel.
Figure 5:
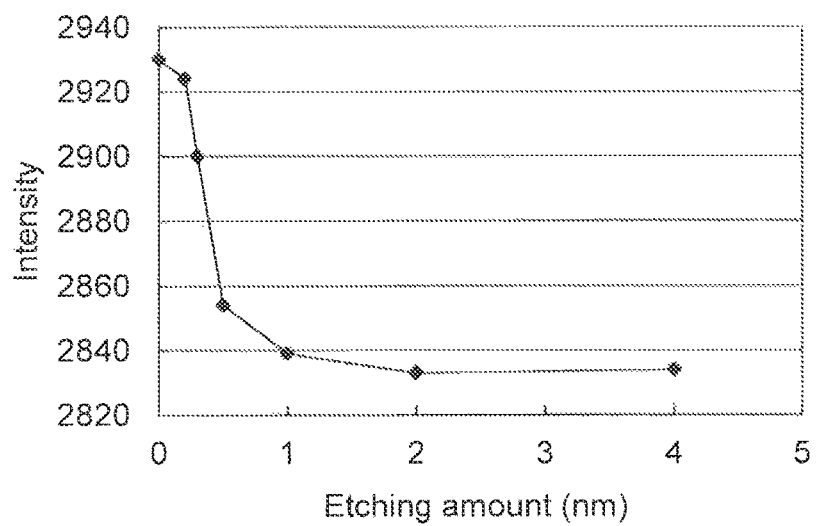
FIG. 5 is a graph showing the relationship between the sputter etching amount and the surface adsorbate layer of the aluminum.

The relationship between the sputter etching amount and the surface adsorbate layer was examined for each of the stainless steel (SUS316) and the aluminum (A1050). The results in the stainless steel are shown in FIG. 4 and the results in the aluminum are shown in FIG. 5. As seen from FIG. 4 and FIG. 5, the surface adsorbate layer was completely removed by etching both the stainless steel and the aluminum with an etching amount of the order of about 1 nm.

REFERENCE SIGNS LIST

1 stainless steel
2 aluminum
3 oxide layer
4 laminate material
5 metal laminate material All publications, patents, and patent applications cited herein are incorporated herein by reference in their entirety.

The invention claimed is:

1. A method for producing a metal laminate material comprising the steps of:
    sputter etching faces to be bonded of a stainless steel and an aluminum such that an oxide layer remains on each face, wherein the etching amount of the surface of the face to be bonded of each of the stainless steel and the aluminum is from 1 nm to 10 nm;
    temporarily bonding the faces to be bonded of the stainless steel and the aluminum by roll pressure bonding, and
    thermally treating the temporarily bonded laminate material at a temperature lower than the recrystallization temperature of the stainless steel to thermally diffuse at least a metal element comprised in the stainless steel into the aluminum, wherein 8 atm % or more of at least Fe element comprised in the stainless steel is diffused at a point 5 nm in the aluminum direction from the bonding interface.

2. The method for producing a metal laminate material according to claim 1, wherein the thermally treating step comprises thermally diffusing the metal element comprised in the stainless steel and the aluminum to each other.

3. The method for producing a metal laminate material according to claim 1, wherein the thermal treatment temperature is from 200° C. to 500° C.

4. The method for producing a metal laminate material according to claim 1, wherein the thermal treatment temperature is from 200° C. to 400° C.

5. The method for producing a metal laminate material according to claim 1, wherein, in the sputter etching step, surface adsorbates are completely removed on the surface of the faces to be bonded of the stainless steel and the aluminum.

6. The method for producing a metal laminate material according to claim 1, wherein the temperature on temporary bonding by roll pressure bonding is from 15° C. to 150° C.

7. The method for producing a metal laminate material according to claim 1, wherein the thickness of the stainless steel before bonding is 0.01 mm to 1 mm and the thickness of the aluminum before bonding is 0.01 mm to 1 mm.

8. The method for producing a metal laminate material according to claim 1, wherein the stainless steel and the aluminum before bonding are each provided in the form of a coil having a width of 100 mm to 600 mm.

\* \* \* \* \*